United States Patent [19]

McElroy

[11] Patent Number: 4,625,300
[45] Date of Patent: Nov. 25, 1986

[54] SINGLE-ENDED SENSE AMPLIFIER FOR DYNAMIC MEMORY ARRAY

[75] Inventor: David J. McElroy, Houston, Tex.

[73] Assignee: Texas Instruments Incorporated, Dallas, Tex.

[21] Appl. No.: 741,205

[22] Filed: Jun. 4, 1985

Related U.S. Application Data

[63] Continuation of Ser. No. 445,813, Dec. 1, 1982, abandoned.

[51] Int. Cl.$^4$ .................. G11C 7/00; G11C 11/40
[52] U.S. Cl. ................................. 365/205; 365/207; 365/210
[58] Field of Search ............. 365/205, 207, 208, 149, 365/210, 203; 307/530

[56] References Cited

U.S. PATENT DOCUMENTS

| | | | |
|---|---|---|---|
| 3,969,706 | 7/1976 | Proebsting et al. | 365/207 |
| 3,983,545 | 9/1976 | Cordaro | 365/205 |
| 4,003,034 | 1/1977 | Au | 365/149 |
| 4,004,284 | 1/1977 | Heeren | 365/149 |

OTHER PUBLICATIONS

Krick, "Self-Differential Sensing of MNOS Memory Arrays", IBM Technical Disclosure Bulletin, vol. 16, No. 12, May 1974, pp. 4098–4099.
Krick, "Dual Level Sense Scheme for Composite Insulator Memory Arrays", IBM Tech. Disc. Bulletin, vol. 17, No. 6, Nov. 1974, pp. 1811–1813.
Coe et al, "Enter the 16,384-Bit RAM", Electronics, Feb. 19, 1976, pp. 116–121.

Primary Examiner—Terrell W. Fears
Assistant Examiner—Glenn A. Gossage
Attorney, Agent, or Firm—John G. Grahan

[57] ABSTRACT

A semiconductor memory device having an array of rows and columns of dynamic one-transistor memory cells uses a single-ended differential sense amplifier connected to each whole column line, rather than separately to column line halves. A bistable circuit with cross-coupled driver transistors has one side connected to the column line by a first coupling transistor which turns off as the row line goes high to trap a fixed reference voltage, then the other side is connected to the column line by a second coupling transistor which turns on after the column line has settled out. This column line voltage is related to whether a 1 or 0 is stored. The time needed to precharge the column line is short because two halves need not be precharged from different levels, and so the memory cycle time is short. Also, the device is less susceptible to errors due to alpha particles because a change of the bit line voltage equally effects both inputs to a sense amplifier.

6 Claims, 2 Drawing Figures

SINGLE-ENDED SENSE AMPLIFIER FOR DYNAMIC MEMORY ARRAY

This is a continuation of application Ser. No. 445,813, filed Dec. 1, 1982 now abandoned.

BACKGROUND OF THE INVENTION

This invention relates to semiconductor memory devices and more particularly to an improved sense amplifier for an MOS random access dynamic read/write memory.

Dynamic MOS memory devices have heretofore used bistable differential sense amplifiers which have inputs connected to bit lines (column lines) which are split in two halves. Dummy cells establish a reference voltage on the unselected halves. Sense amplifiers of this type are shown in U.S. Pat. No. 4,239,993 issued to McAlexander, White and Rao, U.S. Pat. No. 4,081,701 issued to White, McAdams and Redwine, and U.S. Pat. No. 3,940,747, issued to Kuo and Kitagawa, all assigned to Texas Instruments.

The differential sense amplifiers previously used have required a period of time in the cycle for equallizing the bit line halves during precharge. This period has been 50 ns, for example, and when the goal is production of high speed devices this equallization time period becomes a significant factor.

It is the principal object of this invention to provide an improved sense amplifier for a high speed random access read/write memory, particularly for an array of one-transistor cells. Another object is to provide a sense amplifier which may be used in a dynamic memory array with reduced precharge time so the cycle time is short.

SUMMARY OF THE INVENTION

In accordance with one embodiment of the invention, a semiconductor memory device having an array of rows and columns of dynamic one-transistor memory cells uses a single-ended differential sense amplifier connected to each whole column line, rather than separately to column line halves. A bistable circuit with cross-coupled driver transistors has one side connected to the column line by a first coupling transistor which turns off as the row line goes high to trap a fixed reference voltage, then the other side is connected to the column line by a second coupling transistor which turns on after the column line has settled out. This column line voltage is related to whether a 1 or 0 is stored. The time needed to precharge the column line is short because two halves need not be precharged from different levels, and so the memory cycle time is short. Also, the device is less susceptible to errors due to alpha particles because a change of the bit line voltage equally effects both inputs to a sense amplifier.

BRIEF DESCRIPTION OF THE DRAWINGS

The novel feature believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
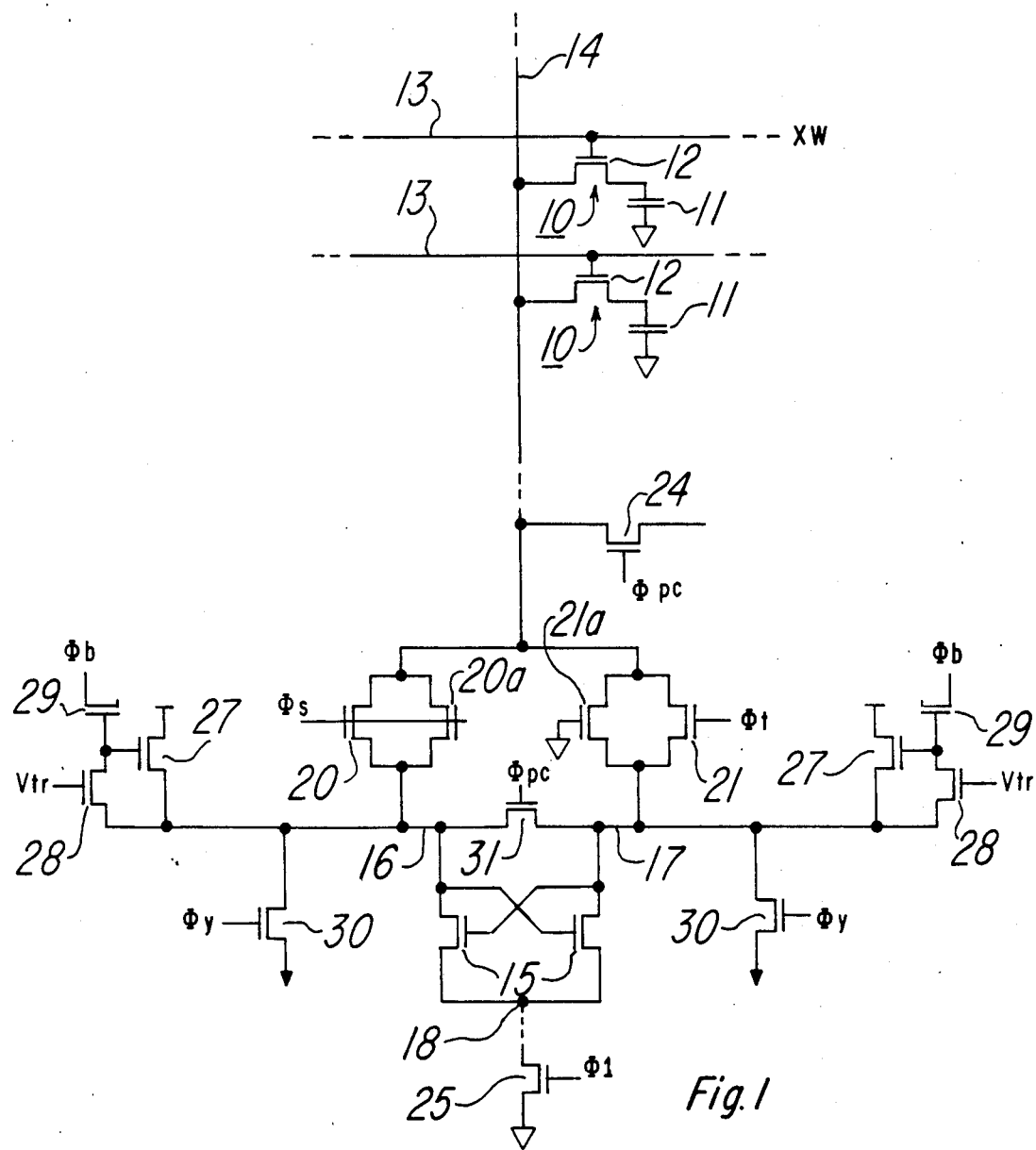
FIG. 1 is an electrical schematic diagram of a part of a memory array showing the sense amplifier circuit of the invention.

Referring to FIG. 1, a single-ended sense amplifier circuit for a dynamic memory is illustrated according to the invention. The memory device is of the type illustrated in U.S. Pat. No. 4,239,993, except the bit lines are not split in halves. An array of one-transistor dynamic memory cells 10 is formed in a semiconductor chip, of the 256K or 1-Megabit configuration, for example. Each cell 10 has a storage capacitor 11 and an access transistor 12. The gates of all transistors 12 in a row are connected to a row line 13, and the drains of all transistors in a column are connected to a column line 14. A 256K device has 512 row lines 13 and 512 column lines 14; usually, the device is partitioned in blocks, so a given column line has only 128 cells on it, for example, whereby the ratio of cell capacitance 11 to capacitance of a bit line 14 is within acceptable limits.

The sense amplifier consists of two cross-coupled driver transistors 15 connecting a pair of sense nodes 16 and 17 to a grounding node 18. The nodes 16 and 17 are connected to the bit line 14 by two separate coupling transistors 20 and 21, having clock voltages $\Phi s$ and $\Phi t$ on the gates. The transistor 20 functions to establish a reference voltage on sense node 16 (like the dummy cell of conventional sense amplifiers), and the transistor 21 functions to couple the sensed cell to the other sense node 17. As seen in the timing diagram of FIG. 2, the clock $\Phi s$ drops before (or at the same time) the selected Xw voltage on one of the row lines 13 goes high, isolating a reference voltage on the node 16, then after the selected cell capacitor 11 has caused the bit line 14 to drop (or not, depending on whether a 1 or 0 is stored), the clock $\Phi t$ drops and isolates the sensed voltage on the node 17.

Each of the bit lines 14 is precharged by transistor 24 which has a clock $\Phi pc$ on its gate. This precharge clock $\Phi pc$ is high during the precharge cycle, then drops before $\Phi s$ or Xw go high, leaving the bit lines 14 at a precharge level of about Vdd. Usually the precharge clock is caused to drop by the receipt of a chip enable $\overline{CE}$ clock from external to the chip. In a device with multiplexed addresses, a row address strobe $\overline{RAS}$ voltage initiates a read cycle; the column address strobe $\overline{CAS}$ would follow. So, $\overline{CE}$ of FIG. 2 corresponds to $\overline{RAS}$ in a multiplexed device.

Figure 2:
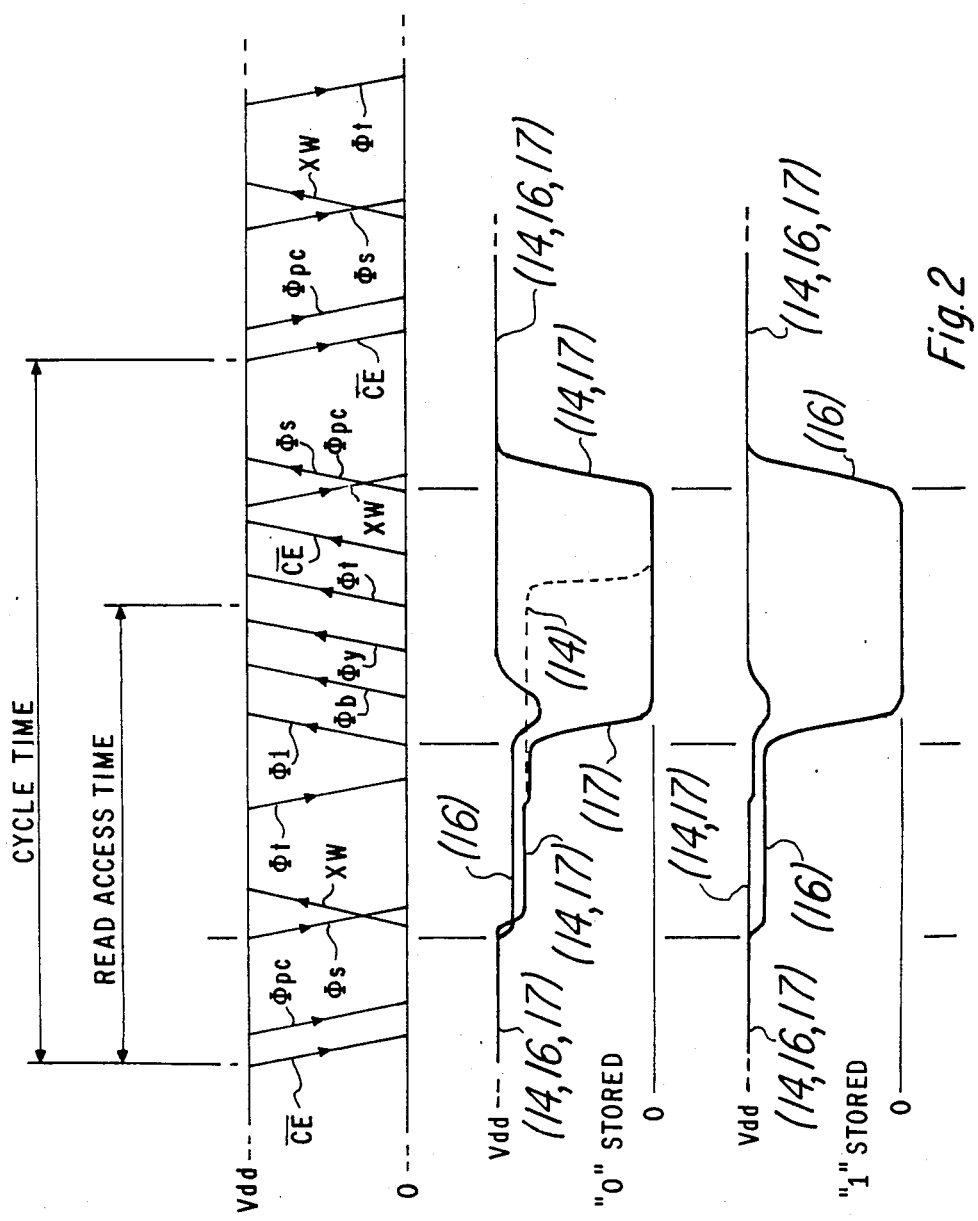
FIG. 2 is a graphic representation of voltage vs. time existing at various parts of the circuit of FIG. 1.

The grounding node 18 is connected to ground through a transistor 25 which has a clock voltage $\Phi 1$ applied to its gate. This clock $\Phi 1$ goes high at about the time $\Phi t$ drops, as seen in FIG. 2, and initiates the latching operation by the cross-coupled driver transistors. The transistor 25 may be shared by all of the sense amplifiers on the chip. Also, instead of a single grounding transistor, there may be two or three which are turned on at slightly delayed times, as set forth in U.S. Pat. No. 4,239,993.

Active pull-up circuits as described in U.S. Pat. Nos. 4,239,993 and 4,081,701 are connected to the sense nodes 16 and 17. These circuits include load transistors 27 which have a boost clock $\Phi b$ on the gates. Shunt transistors 28 with a trap voltage Vtr on the gates connect the gates of the transistors 27 to the nodes 16 or 17. The trap voltage Vtr is at Vdd during precharge, then drops to a voltage of about one or two thresholds below Vdd when $\Phi pc$ drops, so a voltage of Vdd is trapped on the gates of transistors 27, forming the capacitor 29. When one of the nodes 16 or 17 drops toward zero after Φ1 goes high, the transistor 28 on this side turns on, discharging the gate of this transistor 27 and causing the gated capacitor 29 on this side to go to a zero capacitance condition. Thus, when the clock Φb goes high, the transistor 27 on the zero-going side does not turn on, because its capacitor 29 is unformed and its gate is shunted to its source by the transistor 28. On the other side, the transistor 28 is off and the Φb voltage boots the gate of the transistor 27 above Vdd, pulling the node 16 or 17 to a full Vdd level. If the node 17 stays high, a full Vdd is thus available to refresh the selected cell capacitor 11 after Φt goes high again. If node 17 goes low, a zero is refreshed.

The output from the sense amplifier for read operations (or input for write operations) is by a pair of transistors 30 which have Φy on their gates. This Y-select voltage ΦY is obtained from the Y decoder and connects the selected column to an I/O buffer for connection off chip. In read operations, as seen in FIG. 2, the clock Φy goes high at some time after Φ1 goes high.

The transistors 20 and 21 each have transistors 20a or 21a in parallel for the purpose of physically and electrically balancing the sense nodes 16 and 17. The transistor 20a has its gate connected to Φs, like transistor 20, but the transistor 21a has its gate connected to ground. The apparent capacitance on node 16 is larger than the capacitance on the node 17, which decouples more of the charge from node 16 than from node 17, which generates the reference offset (as is conventionally done with a dummy cell of half the size of a storage cell). The transistors 20, 20a, 21 and 21a are all of the same physical size. When Φs goes low, a negative-going offset reduces the voltages on the nodes 16 by a certain amount, say 200 millivolt, but when Φt goes low it reduces the voltage on node 17 by only half this amount because only one transistor is coupling the negative excursion. But added to this effect on node 17 is the offset due to the selected storage capacitor 11. The result is that if a 0 is stored, the node 17 is lower than node 16 after Φt, but if a 1 is stored the node 17 is higher than 16. The latch made up of transistors 15 flips accordingly, after Φ1 goes high.

FIG. 2 also shows the voltages on the bit line 14 and the sense nodes 16 and 17 during an active cycle for the conditions of a stored 1 and a stored zero. It should be noted that the precharge clock Φpc, the word line voltage Xw and the clocks Φs and Φt are booted above Vdd (although shown at Vdd) so that a full Vdd level appears on all nodes.

An important feature of the invention is the operation during the precharge part of the cycle. When Φpc goes high after an active cycle is completed, as seen in FIG. 2, the bit line 14 quickly precharges to Vdd (or Vdd-Vt), and there is no problem of equallizing two separate bit line halves. Heretofore, a long period was used to assure that the bit line halves (one of which is always 1 and the other 0) are at the exact same voltage. The bit line halves were of rather large capacitance, so this equallization period was lengthy. In contrast, the bit line 14 in this invention may charge to a slightly lower voltage if it was a 0, compared to 1, but this is of no consequence since both sides of the sense amplifier will be equally affected. Of course, the nodes 16 and 17 must be equallized, but these are of very small capacitance so this occurs rapidly. A transistor 31 may be used to equallize the nodes 16 and 17 during Φpc. The next cycle can begin by Φpc and Φs dropping after little delay, so the cycle time of the memory device can be shorter, indeed not much longer than the access time.

Another important feature is the relative immunity to errors due to alpha particles. When an alpha particle hits the silicon chip, it creates momentarily a minute conductive area in the surface, and this can disturb a cell or bit line by an amount comparable to the stored data bit or the change in voltage of a bit line in a read operation. In the conventional dynamic RAM circuit where the bit lines are split into halves, an alpha particle thus produces a differential voltage on the sense amplifier inputs, possibly causing an erroneous output. In the circuit of this invention, however, a change in the amount of charge on a bit line 14 due to an alpha particle will be equally reflected in both inputs 16 and 17 to the sense amplifier, and no error results.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A memory device comprising:
an array of rows and columns of dynamic memory cells storing data on storage capacitors, each cell having an access transistor with its drain connected to a column line and its gate connected to a row line,
a single-ended differential sense amplifier connected to each column line, each sense amplifier including a pair of cross-coupled driver transistors and first and second separate coupling transistors, each transistor having a source-drain path and a gate, means connecting the source-drain path of the first coupling transistor between the column line and a first sense node, means connecting the source-drain path of the second coupling transistor between the column line and a second sense node, the source-drain paths of the driver transistors separately connecting the first and second sense nodes to a grounding node, said first sense node having more capacitance than said second sense node,
precharge means for precharging the column lines to a selected voltage prior to the beginning of an active cycle,
a first clock voltage applied to the gates of the first coupling transistors in the sense amplifiers to turn off the first coupling transistors at a first time at the beginning of an active cycle,
row addressing means for applying an activating voltage to the gates of said access transistors in a selected row by one of said row lines at about said first time,
a second clock voltage applied to the gates of the second coupling transistors in the sense amplifiers to turn off the second coupling transistors at a second time in said active cycle after said first time,
wherein grounding means connects said grounding node to reference potential at a third time which is after said first time in said active cycle,
wherein said second clock voltage goes high again after said third time in said active cycle to thereby refresh the selected memory cell via said column line, and wherein each of said first and second coupling transistors has a separate counterpart transistor in parallel therewith, the gate of the counterpart transistor of the first coupling transistor being connected to said first clock voltage, the gate of the counterpart transistor of the second coupling transistor being connected to ground.

2. A device according to claim 1 wherein output means is coupled to at least one of said sense nodes at a fourth time in said active cycle which is after said second time.

3. A semiconductor memory circuit comprising:

a column line selectively connected to a memory cell at a first time;

a differential sense circuit having first and second inputs; the capacitance of said first input being greater than the capacitance of said second input; first and second coupling means for separately connecting the first and second inputs to the column line; and first and second transistors having source-to-drain paths shunting said first and second coupling means, each of the first and second transistors having a gate;

timing means for activating the first coupling means and said gate of the first transistor to connect the first input to the column line prior to said first time and to isolate the first input from the column line after the first time, to thereby establish a reference voltage at the first input;

and timing means for activating the second coupling means to connect the second input to the column line during a period starting prior to said first time and continuing to a second time after said first time and thereafter to isolate the second input from the column line, to thereby establish a voltage at the second input related to the content of the selected memory cell; said gate of the second transistor being connected to a reference potential, whereby sais first and second transistors function to balance said first and second coupling means.

4. A circuit according to claim 3 wherein said timing means against connects the second input to the column line following a delay after said second time to thereby refresh the selected memory cell.

5. A circuit according to claim 3 wherein the memory cell is a dynamic one-transistor cell with a storage capacitor.

6. A circuit according to claim 3 wherein the sense circuit is a bistable cross-coupled sense amplifier.

* * * * *